United States Patent [19]

Funari et al.

[11] Patent Number: 4,849,856
[45] Date of Patent: Jul. 18, 1989

[54] ELECTRONIC PACKAGE WITH IMPROVED HEAT SINK

[75] Inventors: Joseph Funari, Vestal; Mary C. Green, Endicott; Scott D. Reynolds, Endwell; Bahgat G. Sammakia, Johnson City, all of N.Y.

[73] Assignee: International Business Machines Corp., Armonk, N.Y.

[21] Appl. No.: 218,726

[22] Filed: Jul. 13, 1988

[51] Int. Cl.⁴ ............................................. H05T 7/20
[52] U.S. Cl. .................... 361/386; 174/16.3; 165/80.3; 165/185; 357/81
[58] Field of Search ............ 174/16.3; 357/81; 361/381, 383, 386–389; 165/80.2, 80.3, 185

[56] References Cited

U.S. PATENT DOCUMENTS

| | | | |
|---|---|---|---|
| 3,670,215 | 6/1972 | Wilkens et al. | 174/16 HS |
| 4,004,195 | 1/1977 | Harayda et al. | 361/386 |
| 4,012,768 | 3/1977 | Kirk et al. | 357/72 |
| 4,066,839 | 1/1978 | Cossuta et al. | 174/52 PE |
| 4,415,025 | 11/1983 | Horvath | 165/185 |
| 4,593,342 | 6/1986 | Lindsay | 361/386 |
| 4,605,058 | 8/1986 | Wilens | 165/80.2 |
| 4,658,331 | 4/1987 | Berg | 361/386 |
| 4,750,089 | 6/1988 | Derryberry et al. | 361/388 |

Primary Examiner—Gregory D. Thompson
Attorney, Agent, or Firm—1701 North Street; Endicott, NY 13760

[57] ABSTRACT

An electronic package including a first substrate (e.g., printed circuit board), a semiconductor device (e.g., silicon chip), a second circuitized substrate (e.g. polyimide having chrome-copper chrome circuitry thereon) and a heat sink (e.g., extruded aluminum or copper). The heat sink includes pliant members (e.g., pliable leg members) secured thereto or forming part thereof such that the heat sink can be downwardly depressed a predetermined distance to effect contact with the semiconductor device without causing damage thereto. Such downward depression facilitates assembly of the package.

17 Claims, 4 Drawing Sheets

ELECTRONIC PACKAGE WITH IMPROVED HEAT SINK

The invention relates to electronic packages and particularly to electronic packages which utilize a heat sink as part thereof.

BACKGROUND OF THE INVENTION

Electronic packages which include semiconductor devices (e.g., silicon chips) as part thereof are well known in the computer industry, with examples being shown and described in U.S. Pat. Nos. 3,670,215 (Wilkens et al), 4,004,195 (Harayda et al), 4,066,839 (Cossutta et al), 4,012,768 (Kirk et al), 4,415,025 (Horvath), 4,593,342 (Lindsay) and 4,605,058 (Wilens).

Use of high circuit densities in modern semiconductor devices requires the effective removal of heat generated during package operation in order to assure that the operating parameters of such devices are maintained within specified tolerances so as to prevent destruction of the package from overheating. One well known means for providing such heat removal is to utilize a metallic heat sink or similar member which typically forms an integral part of the package. Representative examples of these means are described and illustrated in the aforementioned several patents.

The electronic package of the instant invention includes a heat sink which not only enables facile heat removal of the package's chip component, but also which facilitates assembly of the invention. This is accomplished through the provision of pliant means for the heat sink which permit depression thereof during package assembly to enable the heat sink to physically contact the chip without damaging this delicate component. As will be further defined herein, the chip is electrically connected to a flexible, circuitized substrate which in turn is electrically connected to the package's first substrate. Contact between the depressed heat sink and chip's upper surface, after an appropriate adhesive is applied to the heat sink and/or chip, enables the chip to assume an elevated, spaced position above the first substrate and in direct contact with the heat sink in the final assembly. Sound heat removal and improved package operation resulting therefrom are thus assured.

It is believed that an electronic package possessing the above features, among other, would represent a significant advancement in the art.

DISCLOSURE OF THE INVENTION

It is, therefore, a primary object of the invention to enhance the computer art through the provision of an electronic package possessing the advantageous features cited herein.

It is another object of the invention to provide such a package which can be produced in an expeditious, cost effective manner.

In accordance with one aspect of the invention, there is provided an electronic package comprising a first circuitized substrate, a semiconductor device electrically coupled to the first circuitized substrate, a second circuitized substrate of flexible nature electrically connected to the first circuitized substrate and the semiconductor device for providing electrical coupling between the first substrate and device, and a heat sink positioned on the first circuitized substrate and having the semiconductor device attached thereto at a location between the heat sink and the first circuitized substrate. The heat sink includes pliant means secured thereto or forming part thereof for enabling the heat sink to be depressed a predetermined distance relative to the first circuitized substrate without damaging the semiconductor device.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
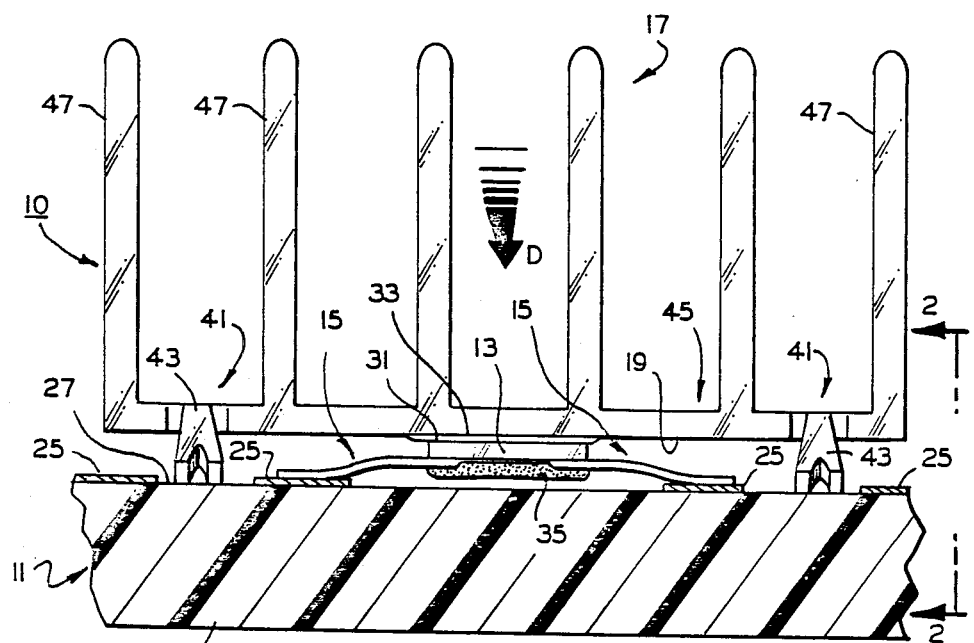
FIG. 1 is a side elevational view, in section, of an electronic package in accordance with a preferred embodiment of the invention.

With particular attention to FIG. 1, there is shown an electronic package 10 in accordance with a preferred embodiment of the invention. Package 10 includes a first circuitized substrate 11, a semiconductor device 13 (e.g., silicon chip) electrically coupled to substrate 11, a second circuitized substrate 15 of flexible nature and electrically connected to first substrate 11 and also to device 13, and a heat sink 17 which, as shown, is positioned on substrate 11 and has the semiconductor device 13 attached to a bottom surface 19 thereof.

First substrate 11 is preferably a printed circuit board having an electrically insulative (e.g., epoxy) body portion 23 with a metallic (e.g., copper) layer of circuitry 25 located on a top surface 27 thereof. Circuitry 25 includes individual conductive segments (as shown) spacedly located on surface 27 and which may be formed on substrate 11 using any one of a number of conventional circuit forming techniques (e.g., photoetched from blanket metal foil). Circuit board 11 is preferably of rigid construction and possesses a thickness within the range of for about 0.030 inch to about 0.200 inch, as is known in the art.

Second circuitized substrate 15 is preferably comprises of a thin layer of an organic dielectric material 26 (e.g., polyimide) having a defined layer of circuitry 28 (e.g., chrome-copper-chrome) formed thereon using techniques known in the art. As shown, this circuitry is located on an upper surface of the polyimide material (FIG. 2) and serves to interconnect the respective circuitry 25 on substrate 11 with respective contact locations located on the bottom surface of the semiconductor device 13. It is also within the scope of the invention to utilize a flexible substrate 15 having circuitry located on a bottom (lower) surface thereof away from heat sink 17. Such an arrangement would substantially prevent electrical contact (and shorting) between the metallic heat sink and conductive circuitry of this element by placing the insulative polyimide therebetween. The defined connections are achieved through the utilization of projecting end segments (not shown) from each end portion of the circuitry located on substrate 15. For example, those projecting segments which are connected to chip 13, also referred to as inner leads, may be connected through a technique (e.g., thermal compression bonding) known in the art. Those segments which connect to the individual circuitry segments 25 on substrate 11, also referred to as outer leads, are also connected thereto using a technique (e.g., soldering) known in the art.

Significantly, utilization of a flexible second circuitized substrate facilitates assembly of the invention. During such assembly, the second circuitized substrate is electrically connected to the chip and first substrate as defined above. Subsequently, contact is provided between the bottom surface 19 of heat sink 17 and the chip's upper surface 31 after an appropriate adhesive is applied to either/both surface. Uniquely, this contact is made possible by downwardly depressing the heat sink (in direction D in FIG. 1) until such contact is effected, whereupon the heat sink is released until it returns to the final, operational orientation illustrated in FIG. 1. The chip, now attached to the heat sink, thus assumes an elevated, spaced position above the substrate 11 (and thus between the substrate and heat sink) as desired. The chip will remain in this position during adhesive cure and will be maintained at this position in the final package assembly. A preferred adhesive (represented by the numeral 33 in FIG. 1) is an epoxy composition including as part thereof a thermally conductive filler (e.g., zinc oxide). One such composition, excluding this filler, is presently available from 3M under the trade designation "Scotchcast". This composition contains about 47.6% by weight of an epoxy polymer, about 52% by weight of a hardener and flexibilizer mixture, and about 0.4% by weight of a coloring agent. Prior to the above contact between chip and heat sink components, it is preferred to encapsulate the bottom surface of the chip and the corresponding, projecting end segments (inner leads) of the flexible circuitized substrate 15 with a suitable encapsulant (e.g., silicone rubber). Such an encapsulant is represented by the numeral 35 in FIG. 1.

Figure 2:
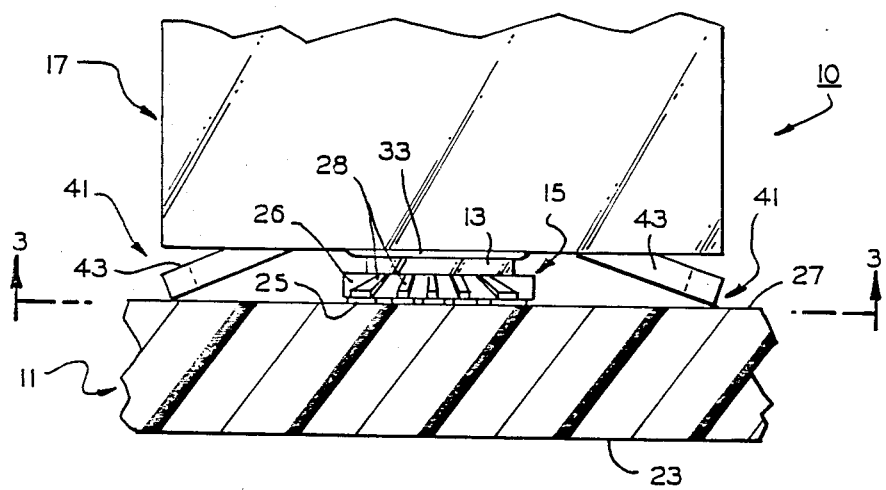
FIG. 2 is an end elevational view, in section, of the invention as taken along the line 2—2 in FIG. 1.
Figure 4:
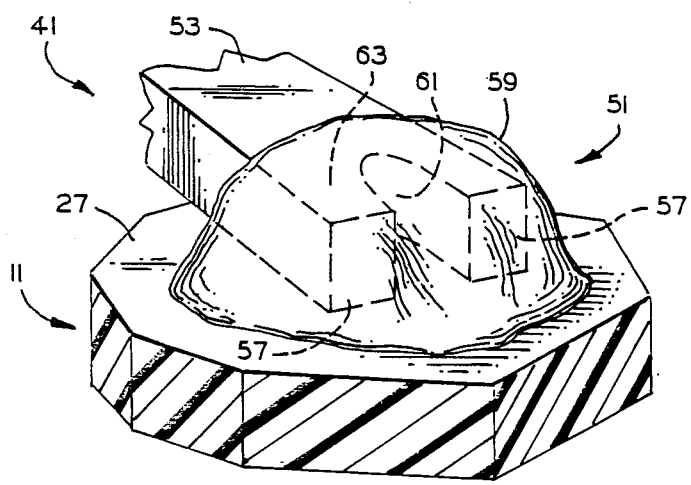
FIG. 4 is an enlarged, partial perspective view of the end portion of a leg member of the invention, showing this leg member attached to the invention's first substrate.

Understandably, the unique ability of heat sink 17 to be downwardly depressed in order to effect contact with chip 13 in the manner defined above represents a significant feature of the instant invention. To provide this capability, heat sink 17 further includes pliant means 41 secured to or forming part of the heat sink and adapted for being positioned on the upper surface 27 of substrate 11 in the manner shown herein (FIGS. 1, 2 and 4). Pliant means 41 as defined herein, enables depression of heat sink 17 during the aforementioned assembly procedure (e.g., by a suitable engaging tool, not shown) such that the heat sink is lowered a predetermined distance relative to substrate 11 and contact with chip 13 is made. In a specific embodiment of the invention, a total of eleven pounds of force was successfully applied to the center of heat sink 17 during assembly of the invention. It was determined that contact between the invention's device and heat sink elements occurred at the application of about nine pounds, resulting in a total depression (deflection) of the heat sink (at its center) of about 0.033 inch. The application of an additional two pounds was preferred to better seat the chip into the then uncured adhesive 33. No damage to the device occurred using these forces. Release of pressure on the heat sink will result in this component returning to its raised, operational orientation, which in turn results in a "lifting" of chip 13 and the corresponding parts of flexible substrate 15. A further understood herein, this unique capability of the invention thus also enables subsequent depression of the heat sink as might occur from inadvertent contact to final the package assembly (e.g., by a computer operator and/or repairperson). Still further, the flexible nature of the heat sink as defined herein compensates for movement by the first substrate as might be caused by the application of bending and/or torque forces thereto without causing dislodgement of the heat sink therefrom.

During the aforementioned assembly of package 10, the defined force necessary to effect positive downward depression of heat sink 17 to complete contact with chip 13 while preventing damage thereto is applied during such assembly. As will be defined hereinbelow, however, other means are acceptable to define the precise distance that heat sink 17 will be depressed while still assuring contact with chip 13. Prevention of such damage is critical in the instant invention due to the placement of the relatively delicate semiconductor chip between the heat sink and substrate 11 components of the invention. Understandably, excessive depression of either or both of these components can in turn cause damage to the chip.

Figure 3:
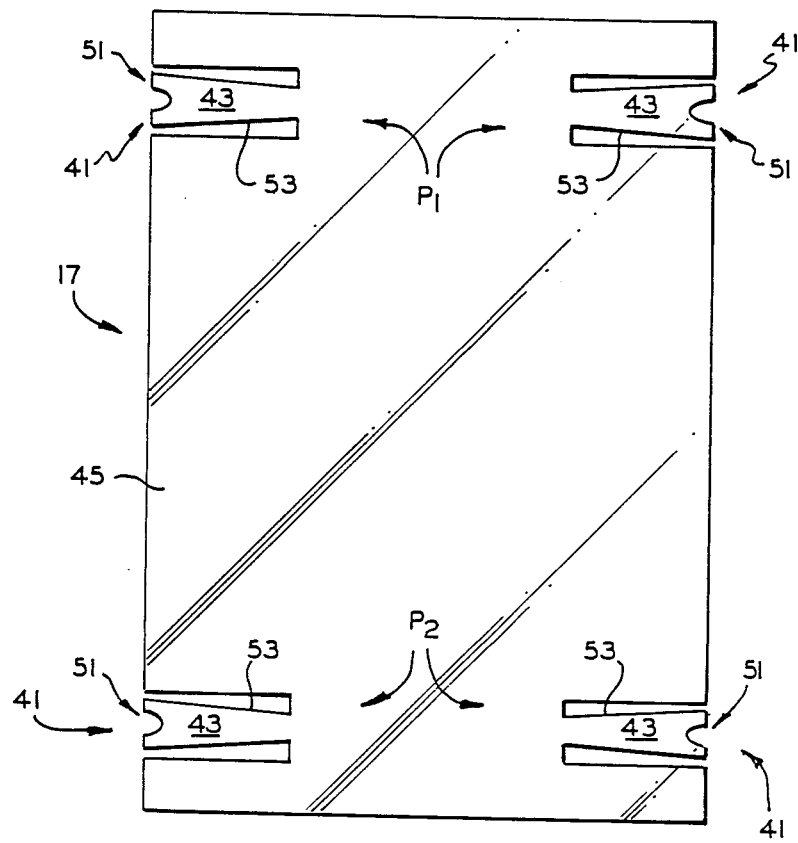
FIG. 3 is a bottom, plan view of the heat sink of the invention as taken along the line 3—3 in FIG. 2.

In accordance with a preferred embodiment of the invention, pliant means 41 comprises a plurality of leg members 43 which are either secured to or form part of the lower body segment 45 of heat sink 17 (the upwardly projecting, spaced fins 47 comprising the upper segment). As shown in FIGS. 1-3, a total of four legs 43 are utilized with each being located at a respective corner of the rectangularly shaped (FIG.3) heat sink. Each leg as also shown in FIGS. 1 and 2, extends downwardly at an acute angle with the substantially planar body segment 45 to thus be in contact with substrate 11 at four spaced locations thereon. Preferably, each leg 43 constitutes an integral part of the heat sink and is formed concurrently with the formation of this larger component. Heat sink 17 is preferably of extruded aluminum material which enables such concurrent formation. Alternatively, heat sink 17 can be comprises of another metallic material (e.g., copper). These leg member, being pliable as defined, are arranged in two pairs (P1, P2 in FIG. 3) wherein legs in each of said pairs extend outwardly from the main body section of the heat sink in a direction substantially opposite to the other. Understandably, alternative orientations for these members are readily possible but the opposed arrangement depicted in FIG. 3 is preferred and has worked successfully.

As also shown in FIG. 3, each leg member 43 includes a bifurcated end portion 51 and a substantially tapered body portion 53. Bifurcated end portion 51 includes a pair of projecting segments 57 (FIG. 4) each serve to contact (engage) the upper surface 27 of substrate 11. Attachment of each leg to substrate 11 is preferably attained through the use of either an adhesive 59 (of a type defined above) or a quantity of solder (e.g., tin-lead), not shown. A bifurcated end portion is particularly desired when using an adhesive because such a configuration forces portions of the adhesive to be located both within the internal slot 61 defined by the end segments 57 and atop the leg's upper surface 63 when the leg is placed on the previously positioned, but uncured adhesive. Thus, a "rivet" is provided by the adhesive to effect positive leg-substrate attachment. Alternatively, it is also within the scope of the invention to secure leg members by some mechanical means (e.g., a clamp) rather than by adhesive or solder as mentioned above. For example, a clamp (not shown) could be secured to the substrate 11 at each location designed to accept a corresponding leg member. With the leg in position, the clamp could be activated to retain the leg.

In order to increase the distance between the bottom surface 19 of heat sink 17 and the upper surface 27 of substrate 11 (e.g., to facilitate inspection, assembly, maintenance, etc.), it is also within the scope of the invention to provide leg members of greater length than those as illustrated in the drawings. To reduce the corresponding distance required to effect chip contact, a pedestal or protrusion (not shown) can be added to the heat sink's undersurface and designed to align with the chip during heat sink depression. Such an increased spacing would also serve to reduce the likelihood of electrical shorting between the flexible substrate and heat sink elements especially in the event that the substrate's circuitry is located on an upper surface of the substrate and thus facing heat sink 17. Further assurance against such shorting can also be provided through utilization of an insulative coating (e.g., sprayed polyimide) on the heat sink's undersurface, or, alternatively, by anodizing the heat sink (or at least the undersurface thereof) to provide such insulation during formation of this element.

Figure 5:
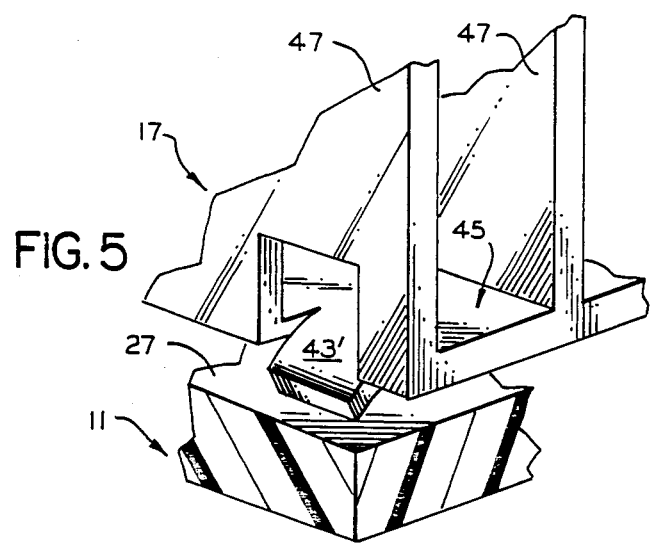
FIG. 5 is a partial perspective view of an alternative embodiment of a leg member for use in the invention.

In FIG. 5, there is shown a leg member 43' in accordance with an alternative embodiment of the invention. Leg 43' as shown, extends downwardly from the heat sink's body segment 45 but in a direction substantially orthogonal to the parallel planes occupied by the heat sink's upwardly projecting fins 47. As in the embodiment of the invention depicted in FIGS. 1-3, a total of four such legs 43' are utilized. Thus, all four of such legs extends in this substantially orthogonal manner while also occupying opposingly oriented pairs. Specifically, these legs are also in two adjacent pairs as in FIG. 3, with each of those legs in a respective pair projecting opposite to the other. As shown in the drawings, each of the leg members of the invention engage the designated surface (27) of substrate 11 at a spaced location (distance) from the flexible, second circuitized substrate 15. See especially FIGS. 1 & 2. The invention's pliant means does not, therefore, contact the flexible substrate during depression of the heat sink 17.

Figure 6:
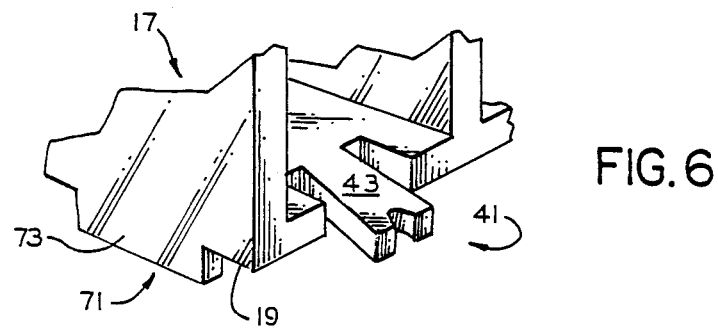
FIG. 6 is a partial perspective view of a stop means for use in the invention.

There is shown in FIG. 6 a stop means 71 which may also be utilized in the instant invention for the purpose of defining the predetermined distance that heat sink 17 may be depressed relative to substrate 11. As shown, stop means 71 comprises a projection 73 which extends downwardly from the end (or side) wall of the heat sink below the planar bottom surface 19. Understandably, the bottom edge of this stop means is designed for engaging the upper surface of substrate 11. As shown, stop means 71 preferably comprises an integral part of the heat sink's end wall. Understandably, stop means 71 extends downwardly a distance slightly greater than the thickness of chip 13, adhesive 33 and substrate 15 (and encapsulant 35, if used). In one example of the invention, stop 17 extended downwardly a total distance of 0.033 inch.

Figure 7:
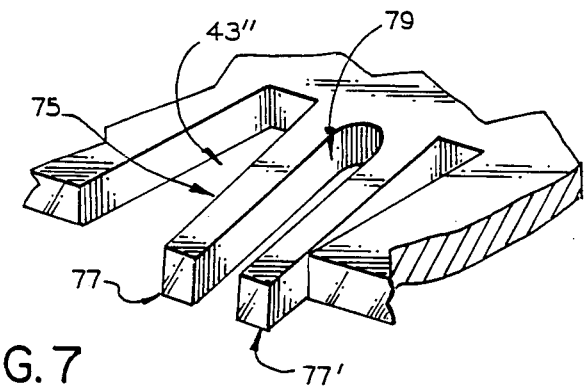
FIG. 7 is a partial perspective view of an alternative embodiment of a leg member capable of being used in the invention.

In FIG. 7, there is shown a leg member 43" in accordance with an alternative embodiment of the invention. As shown, leg member 43" includes a bifurcated body portion 75 including two separate, elongated projecting leg segments 77 and 77' which is turn define an elongated, internal slot 79 which extends substantially the entire length of the leg's body portion. This elongated, bifurcated configuration even further promotes formation of the aforementioned adhesive "rivet" to thus fixedly secure the heat sink to the rigid, bottom substrate 11.

Figure 8:
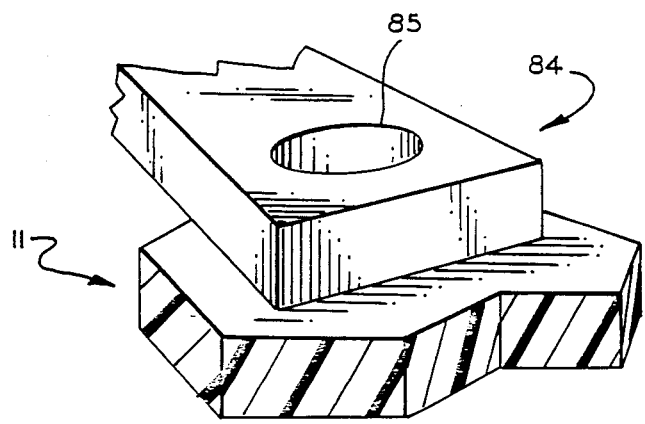
FIG. 8 is an enlarged, partial perspective view of a leg member in accordance with an alternative embodiment of the invention.

In FIG. 8, an alternative embodiment for the end portion of a leg member capable of being used in the invention is shown. Rather than a bifurcated end (as defined above), leg 84 includes an aperture 85 within the tapered body portion thereof. Thus, when the leg is positioned on substrate 11, the aforedefined adhesive (not shown) will be forced up through the aperture and over onto the body portion's top surface, also forming a "rivet" to assist in fixedly securing the leg in final position.

Figure 9:
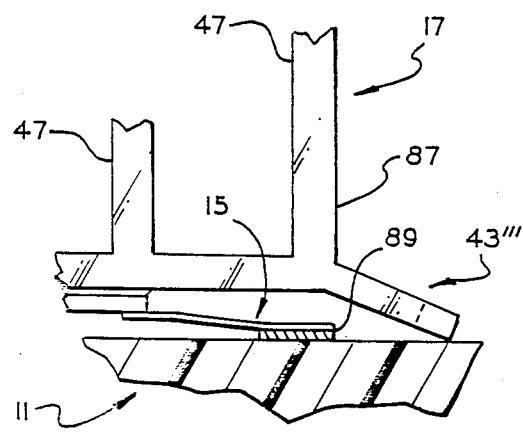
FIG. 9 is a partial side elevational view depicting yet another embodiment of a leg member for use in the invention, this leg member shown as forming a part of a flange which projects externally from the side of the invention's heat sink.

In FIG. 9, there is shown yet another embodiment of a leg member 43''', adapted for use in the invention. Leg member 43''' is shown as projecting externally from heat sink 17 in a manner substantially opposite to the legs of the invention as depicted in FIGS. 1-3. Like leg 43' in FIG. 5, leg 43''' projects in a substantially orthogonal, downward manner relative to the parallel, spaced fins 47. Preferably, each leg is formed from a projecting flange which extends from the heat sink, the remainder of the flange being removed (e.g., cut away) following such leg formation. In a preferred version of this embodiment, heat sink 17 would include two opposed flanges with a pair of leg members 43''' formed from each flange. This arrangement assures full coverage of the flexible substrate 15 such that the outer edge 87 of the heat sink substantially aligns with the corresponding outer edge 89 of substrate 15 located thereunder.

While there have been shown and described what are at present considered the preferred embodiments of the invention, it will be obvious to those skilled in the art that various changes and modifications may be made therein without departing from the scope of the invention as defined by the appended claims. For example, it is readily possible to utilize fins 47 for the invention's heat sink which are spaced apart greater than as depicted in FIG. 1 and/or possess a shorter height, depending on the heat dissipation characteristics and package spacing requirements of the system in which the invention is employed.

What is claimed is:
1. An electronic package comprising:
   a first circuitized substrate;
   a semiconductor device electrically coupled to said first circuitized substrate;
   a second circuitized substrate of flexible nature electrically connected to said first circuitized substrate and said semiconductor device for providing said electrical coupling between said first circuitized substrate and said semiconductor device; and a heat sink positioned on said first circuitized substrate and having said semiconductor device attached thereto at a location between said heat sink and said first circuitized substrate, said heat sink including integral pliant means for positioning said heat sink on said first circuitized substrate and for enabling said heat sink to be depressed a predetermined distance relative to said first circuitized substrate without damaging said semiconductor device, said pliant means engaging a surface of said first circuitized substrate at a spaced location from said second circuitized substrate such that said pliant means does not contact said second circuitized substrate during said depression of said heat sink.

2. The electronic package according to claim 1 wherein said first circuitized substrate is a printed circuit board having circuitry located on a surface thereof, said second circuitized substrate being electrically connected to said circuitry.

3. The electronic package according to claim 1 wherein said second circuitized substrate comprises a flexible, electrically insulative member having circuitry located thereon, said circuitry of said second substrate being electrically connected to corresponding contact locations on said semiconductor device.

4. The electronic package according to claim 1 wherein said pliant means comprises a plurality of leg members spacedly located on said heat sink and extending therefrom, each of said leg members being securely positioned on said first circuitized substrate.

5. The electronic package according to claim 4 wherein the number of said leg members is four, each of said leg members being located at a respective corner of said heat sink.

6. The electronic package according to claim 4 wherein each of said leg members is securely positioned on said first circuitized substrate using solder.

7. The electronic package according to claim 4 wherein each of said leg members is securely positioned on said first circuitized substrate using an adhesive.

8. The electronic package according to claim 7 wherein each of said leg members includes a bifurcated end portion defining and internal slot therein.

9. The electronic package according to claim 8 wherein said adhesive is located substantially within said internal slot and atop an upper surface of each of said leg members to fixedly secure said leg members to said first substrate.

10. The electronic package according to claim 8 wherein each of said leg members includes a body portion having a substantially tapered configuration.

11. The electronic package according to claim 8 wherein each of said leg members further comprises a bifurcated body portion.

12. The electronic package according to claim 7 wherein each of said leg members includes an aperture therein.

13. The electronic package according the claim 12 wherein said adhesive is located within said aperture and atop an upper surface of each of said leg members to fixedly secure said leg members to said substrate.

14. The electronic package according to claim 4 wherein each of said leg members comprises flange member projecting from said heat sink.

15. The electronic package according to claim 1 wherein said heat sink further includes integral stop means for engaging said first circuitized substrate during said depressing of said heat sink to limit the movement of said heat sink.

16. The electronic package according to claim 1 wherein said heat sink is comprised of metallic material.

17. The electronic package according to claim 16 wherein said metallic material is selected from the group consisting of aluminum and copper.

* * * * *

UNITED STATES PATENT AND TRADEMARK OFFICE
CERTIFICATE OF CORRECTION

PATENT NO. : 4,849,856

DATED : July 18, 1989

INVENTOR(S) : Joseph Funari et al

It is certified that error appears in the above—identified patent and that said Letters Patent is hereby corrected as shown below:

Page 1 (cover page) - the attorney to be identified should be -- Lawrence R. Fraley -- and not "1701 North Street; Endicott, NY 13760".

Signed and Sealed this

Fifteenth Day of May, 1990

Attest:

HARRY F. MANBECK, JR.

Attesting Officer      Commissioner of Patents and Trademarks